(12) United States Patent
Iwamura (10) Patent No.: US 8,178,471 B2
(45) Date of Patent: May 15, 2012

(54) HYDROGEN STORAGE MATERIALS AND PROCESS FOR THE PREPARATION OF THE SAME

(75) Inventor: Eiji Iwamura, Kanagawa (JP)

(73) Assignee: Japan Science and Technology Agency, Saitama (JP)

( * ) Notice: Subject to any disclaimer, the term of this patent is extended or adjusted under 35 U.S.C. 154(b) by 1347 days.

(21) Appl. No.: 10/538,470

(22) PCT Filed: Jan. 22, 2004

(86) PCT No.: PCT/JP2004/000564
§ 371 (c)(1),
(2), (4) Date: Jun. 9, 2005

(87) PCT Pub. No.: WO2004/067166
PCT Pub. Date: Aug. 12, 2004

(65) Prior Publication Data
US 2006/0014638 A1    Jan. 19, 2006

(30) Foreign Application Priority Data

Jan. 31, 2003  (JP) ................................. 2003-023697

(51) Int. Cl.
*C01B 31/08* (2006.01)
*C23C 14/00* (2006.01)
(52) U.S. Cl. .................................. 502/417; 204/298.01
(58) Field of Classification Search .............. 423/445 R; 204/298.01–298.29; 502/416–439
See application file for complete search history.

(56) References Cited

U.S. PATENT DOCUMENTS

| | | | | |
|---|---|---|---|---|
| 4,503,125 A | * | 3/1985 | Nelson et al. ................ | 428/408 |
| 4,844,785 A | * | 7/1989 | Kitabatake et al. ...... | 204/192.11 |
| 5,478,456 A | * | 12/1995 | Humpal et al. .......... | 204/192.13 |
| H1924 H | * | 12/2000 | Zabinski et al. ......... | 204/192.16 |
| 2001/0009221 A1 | * | 7/2001 | Anzaki et al. ............ | 204/192.12 |
| 2001/0031346 A1 | * | 10/2001 | Iwamura ...................... | 428/212 |
| 2002/0096048 A1 | | 7/2002 | Cooper et al. | |
| 2002/0146624 A1 | | 10/2002 | Goto et al. | |

FOREIGN PATENT DOCUMENTS

| | | |
|---|---|---|
| JP | 2001-106516 | 4/2001 |
| JP | 2002-028483 | 1/2002 |
| JP | 2002-320848 | 11/2002 |
| JP | 2002-361076 | 12/2002 |
| JP | 2003-013200 | 1/2003 |

(Continued)

OTHER PUBLICATIONS

Bauer, et al., Mechanical properties and performance of magnetron-sputtered graded diamond-like carbon films with and without metal additions, Diamond and Related Materials 2002; 11: 1139-1142.*

(Continued)

*Primary Examiner* — Daniel C. McCracken
(74) *Attorney, Agent, or Firm* — Jenkins, Wilson, Taylor & Hunt, P.A.

(57) ABSTRACT

There are provided hydrogen storage materials comprising a first region composed primarily of an amorphous carbon containing at least one metal element selected from the group consisting of Ti, Zr, Hf and Y, and a second region composed primarily of an amorphous carbon having a density lower than that of the first region.

6 Claims, 5 Drawing Sheets

FOREIGN PATENT DOCUMENTS

| | | |
|---|---|---|
| JP | 2003-165701 | 6/2003 |
| JP | 2003-321216 | 11/2003 |
| WO | WO 01/53550 | 7/2001 |
| WO | WO 2004/067166 | 8/2004 |

OTHER PUBLICATIONS

Zhang, et al., Residual stress characterization of diamond-like carbon coatings by an X-ray diffraction method, Surface Coatings Technology 1999; 122: 219-224.*

International Preliminary Report on Patentability corresponding to International Patent Application No. PCT/JP2004/000564 dated Sep. 2, 2005.

International Search Report corresponding to International Patent Application No. PCT/JP2004/000564 dated Apr. 27, 2004.

Supplementary European Search Report corresponding to European Patent Application No. 04704364.1-2111 dated Mar. 21, 2011.

"Introduction to X-ray Diffraction," MRL: Materials Research Laboratory at UCSB: an NSF MRSEC. <http://www.mrl.ucsb.edu/mrl/centralfacilities/xray/xray-basics/index.html> pp. 1-7 (Accessed on Aug. 15, 2011).

* cited by examiner

HYDROGEN STORAGE MATERIALS AND PROCESS FOR THE PREPARATION OF THE SAME

FIELD OF THE INVENTION

The present invention relates to a hydrogen storage material comprising an amorphous carbon, and a process for preparation of the same.

BACKGROUND OF THE INVENTION

In recent years, for using a clean energy, public attention is attracted to a technology utilizing hydrogen in fuel battery and heat pump, and in the storage of a natural energy, etc. In these hydrogen utilizing technologies, hydrogen storage alloys are conventionally used in order to conduct the occlusion and release of hydrogen. However, these hydrogen storage alloys have drawbacks that they are heavy in weight, and when the occlusion/release process is repeated, material degradation occurs and exhibit decreased hydrogen storage capability (deterioration of the repeated properties).

Under such circumstances, a technology has been recently studied which utilizes a carbon-type material such as carbon nanotube, graphite nanofiber, etc. wherein hydrogen is occluded in a void caused from the crystal defect, layer structure etc. of the carbon structure. Particularly, attention is currently focused on amorphous carbon materials which are generally said to exhibit little deterioration of the repeated properties of the hydrogen occlusion/release as described above (for example, refer to Unexamined Japanese Patent Publications(Kokai) 2001-106516 and 2002-28483).

However, even if these carbon materials are used, it must be said that the improvement of the repeated hydrogen occlusion/release properties are not still satisfactory. This is believed to be attributable to the fact that the hydrogen storage site (the site in which hydrogen is retained) and the adsorption/release site (the site in which hydrogen migration occurs with the desorption of hydrogen from the hydrogen storage site) are on the identical place, and therefore the carbon structure breaks down and changes due to the repeated occlusion/release process.

SUMMARY OF THE INVENTION

The present invention intends to solve the above problems. It is an object of the present invention to provide hydrogen storage materials not only having a high hydrogen storage capability per weight but also exhibiting no deterioration of the properties when the occlusion and release process of hydrogen is repeated, and to provide a process for the preparation of such hydrogen storage materials.

In order to attain the above object, the hydrogen storage materials of the present invention comprise a first region composed primarily of an amorphous carbon containing at least one metal element selected from the group consisting of Ti, Zr, Hf and Y, and a second region composed primarily of an amorphous carbon having a density lower than that of the first region.

According to the present invention, it is believed that hydrogen is stored in the vicinity of a metal element such as Ti, Zr, Hf and Y etc. which easily produce a hydride, while the desorbed hydrogen migrates predominantly from a second region of lower density. Thus, even if the occlusion and release process is repeated, the properties of the hydrogen storage materials do not deteriorate.

Alternatively, the hydrogen storage materials of the present invention comprise a void present in an amorphous carbon containing at least one metal element selected from the group consisting of Ti, Zr, Hf and Y.

According to the present invention, thus, it is believed that hydrogen is stored in the vicinity of a metal element such as Ti, Zr, Hf and Y etc. which easily produce a hydride, while the desorbed hydrogen is migrated predominantly through the void. Accordingly, even if the occlusion and release process of hydrogen is repeated, the properties of the hydrogen storage materials do not deteriorate.

In the hydrogen storage materials, it is preferred that the content of the metal element is from 0.02 to 30 atomic %.

It is preferable that the hydrogen storage materials are in the form of a film, and the second region or the void extends to a thickness direction of the film.

A process for the preparation of hydrogen storage materials according to the present invention comprises providing a source of carbon containing at least one metal element selected from the group consisting of Ti, Zr, Hf and Y, and forming a film composed of an amorphous carbon containing said metal element on the surface of a base material at a temperature of 773 K or less according to a gas phase synthesis.

Further, a process for the preparation of hydrogen storage materials according to the present invention comprises providing a source of carbon containing at least one metal element selected from the group consisting of Ti, Zr, Hf and Y, and forming a film composed of an amorphous carbon containing said metal element on the surface of a base material under a process gas pressure of 1.33322 Pa or more according to a sputtering process.

DESCRIPTION OF THE PREFERRED EMBODIMENT

The following is a description with respect to one embodiment of hydrogen storage materials and processes for the preparation of the same according to the present invention.

Figure 1:
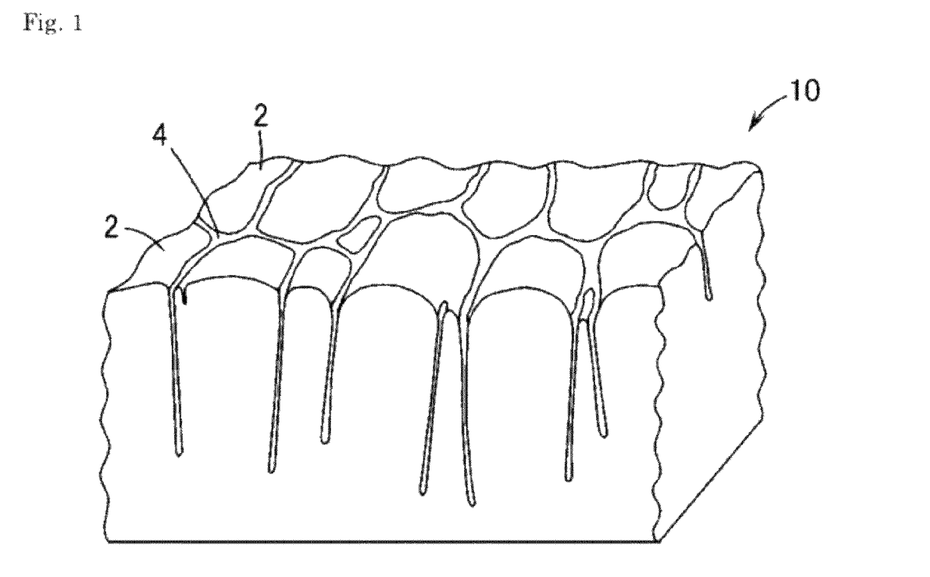
FIG. 1 is a perspective view showing the cross section of the texture of a hydrogen storage material according to the present invention.

FIG. 1 is a perspective view showing schematically the cross section of the texture of a hydrogen storage material according to the present invention. Referring to FIG. 1, there is shown a hydrogen storage material 10 comprising a plurality of column-like first regions 2 and second regions 4 present in the form of a network in between the first regions 2. In this embodiment, the hydrogen storage material 10 is in the form of a film wherein the second region 4 extends to a thickness direction (the top and bottom directions of FIG. 1). According to the embodiment, the hydrogen storage material 10 assumes the form of a film formed according to a gas phase synthesis.

Figure 2:
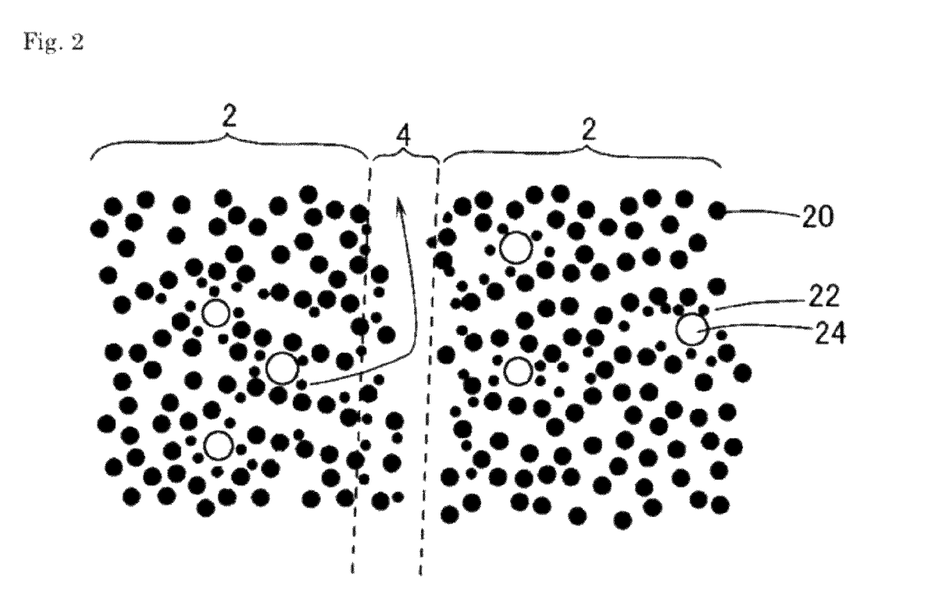
FIG. 2 is a partially enlarged section view of FIG. 1.

FIG. 2 is a partially enlarged section view of FIG. 1. Referring to FIG. 2, the first region 2 comprises at least one metal element 24 selected from the group consisting of Ti, Zr, Hf and Y present in an amorphous carbon structure wherein carbon atoms 20 are randomly bonded to each other. Amorphous carbon is called by various names such as non-crystalline carbon, diamond-like carbon, glassy carbon, etc. However, these terms are not clearly distinguished from each other. Generally, amorphous carbon is a solid wherein carbon atoms are bonded to each other in the form of a network, and it has no periodic atomic arrangement of a long distance as in the so-called crystal structure.

Metal element 24 easily produces a hydride. It is believed that the metal element 24 can combine with a hydrogen atom 22 which penetrated into a hydrogen storage material 10 to form, for example, a metallic hydride or an interstitial hydride whereby a large amount of hydrogen is stored within the hydrogen storage material 10. This metal element is Ti, Zr, Hf or Y. They can be included singly or in a combination of two or more. It is preferable that the content of the metal element relative to the hydrogen storage material 10 is from 0.02 to 30 atomic %. When the content of the metal element is under 0.02 atomic %, the hydrogen storage material 10 can not store a satisfactory amount of hydrogen. On the other hand, when the content is above 30 atomic %, a carbide or a carbide-like cluster is formed in between the metal element and carbon atom so that the hydrogen storage material 10 dose not function as an effective hydrogen storage site, or the formation of a second region 4 as described hereinafter is adversely affected. More preferably, the content of the metal element is from 1 to 15 atomic %.

On the other hand, the second region 4 is composed of an amorphous carbon having a density lower than that of the first region 2. This amorphous carbon is as described with respect to the first region 2. The difference in density between the second region 4 and the first region 2 is not particularly restricted. However, it is preferable that the second region 4 has a density lower in a proportion of from 10 to 40% than that of the first region 2. When this density difference is under 10%, it is believed that the second region does not function as an adsorption/desorption site as described hereinafter, so that the repeating properties of hydrogen occlusion/release degrade. On the other hand, when the density difference is in excess of 40%, the proportion of a first region which becomes a hydrogen storage site is low so that the hydrogen storage amount decreases.

The method of determining a difference in density between a first region and a second region includes a process of obtaining a difference in energy absorption in response to a difference of density according to EELS (Electron Energy Loss Spectroscopy).

The density of the entire hydrogen storage material (an average value of the densities of a first region and a second region) varies with the content of a metal element. For example, it is on the order of from 1.4 to 2.2 g/cm$^3$ in a metal element-free state. Further, the proportion of the volume of the second region relative to the first region present in the entire hydrogen storage material is not particularly restricted. When the thickness of the hydrogen storage material is on the order of 1 μm, the volume of a second region in the surface layer portion of the material is on the order of 20% or less relative to that of the first region.

The void between a first region 2 and a first region 2, that is, the width of a second region 4 in the left and right directions of FIG. 2 is not particularly restricted but can be on the order of, for example, from 1 nm to several nm. Further, when the hydrogen storage material of the present invention is formed into a film according to a gas phase synthesis as described hereinafter, the more the thickness of the film, the larger the width of the second region.

As stated above, the second region 4 has a density lower than that of the first region 2. Thus, when the hydrogen 22 occluded in a storage site in the vicinity of the metal element 24 is desorbed from this storage site to migrate within the hydrogen storage material, it is believed that it migrates through the second region 4 easy for it to move. For this reason, it is considered that the hydrogen storage site (in the vicinity of the metal element 24 in the first region 2) differs from the absorption/release site (the second region 4) so that the change of carbon structure due to the repeating of a hydrogen occlusion/release process is difficult to occur. The repeated properties, thus, do not deteriorate. Further, the hydrogen atom is incorporated from the second region 4 into the hydrogen storage material due to capillary phenomenon whereby thermal and physical hydrogen absorption and desorption can be effected at low temperatures (on the order of 600 K).

In the above embodiment, we describe a case that a second region 4 is lower in density than a first region 2. However, the present invention includes also a case where a void is present in place of the second region 4. When a void is present, it is believed that the hydrogen stored in the storage site of the first region 2 migrates within the hydrogen storage material through the void easy for it to move whereby an adsorption/release process is effected. The width (diameter) of the void, and the volume proportion of the first region relative to the void are substantially the same as in the second region. However, the void width, and the volume percentage of the void relative to the first region tend to increase as compared with a case that a second region is present. It is believed that this tendency is attributable to the fact that according as the width between columns expands, the void is not completely filled with a network of carbon bond so that a clearance forms. Alternatively, the second region can be also present in combination with the void.

When the hydrogen storage material of the present invention is prepared in the form of a film, for example, according to a gas phase synthesis as described hereinafter, and a second region (void) extends to a thickness direction of the film, then the hydrogen atom is adsorbed and desorbed in the thickness direction of the film. Therefore, by providing a differential pressure on both sides of a film, the hydrogen can be easily penetrated into the thickness direction of the film whereby the hydrogen occlusion reaction is accelerated. Further, by occluding hydrogen within a film in a pressurized atmosphere, the hydrogen occlusion reaction can be accelerated. When the hydrogen storage material is used in the form of a film, a plurality of films can be also used in the form of a stack or a lamination.

Next, we will describe one embodiment of the processes for preparation of hydrogen storage materials to which the present invention relates. First, it is known that the column structure shown in FIG. 1 produces due to the formation of a non-uniform solid phase on a base plate from the gas phase when a subject (an amorphous carbon in the present invention) is formed into a film on the base plate according to a gas phase synthesis. That is, once a solid phase of a subject is nonuniformly formed on a base plate to produce an excessive portion of solid phase, a solid phase is subsequently formed predominantly on this portion so that a column structure grows.

In the processes for preparation of the present invention, accordingly, it is essential to use a gas phase synthesis. Further, in order to develop this column structure, it is good to decrease the mobility of a subject atom deposited on a base plate. That is, when the mobility of a subject atom is high, a thermal motion is caused on a base plate, and some atoms formed, in a solid phase state, on the base plate are physically spattered so that the formation of a uniform solid phase is promoted. Thus it is difficult to form a non-uniform solid phase.

In the processes for preparation of the present invention, the temperature of a base plate is lowed when using a gas phase synthesis or process gas pressure is raised when using a sputtering process so as to decrease the mobility of an atom. When the base plate temperature is set at a low value, the thermal energy of a subject atom deposited on a base plate is absorbed by the base plate so that its mobility is decreased. On the other hand, when the process gas pressure is set at a high value, the subject atom collides against a process gas before reaching a base plate so that the proportion of losing energy is high.

The gas phase synthesis used in the process for preparation of the present invention can be any physical vapor deposition (PVD) method. For example, vacuum deposition, sputtering, ion plating, ion beam evaporation, etc. can be used. Further, a combination process of a PVD principle with a chemical deposition such as, for example, reactive sputtering, etc. can be also used. The shape and type of a base materials when using a gas phase synthesis are not particularly restricted. For example, a silicon (Si) base plate can be used. As the target used in a gas phase synthesis, one can use any source of carbon containing a metal element to form a film composed of an amorphous carbon. As such a carbon source, for example, a calcined graphite can be used, and a chip of metal element can be disposed on or built in this calcined graphite can be used as a target described above.

According to a process for preparation of the first present invention, it is necessary to use a base plate temperature of 773 K or less in a gas phase synthesis. When the base plate temperature is in excess of 773 K, not only does the above column structure not satisfactorily grow but also the amorphous carbon can not form into a film. The base plate temperature is preferably 473 K or less, and more preferably ordinary temperature or less. The lower limit value of the base plate temperature is not particularly restricted. The base plate can be cooled with water to a temperature of the order of from 0 to 10° C. (from 273 to 283 K) or to a temperature of the order of a liquid nitrogen temperature (77 K). The point is, the base plate temperature can be determined according to performances of deposition apparatuses, production conditions, and the like.

According to a process for preparation of the second present invention using a sputtering process, it is necessary to use a process gas pressure of 1.33322 Pa or more. Then, the process gas is ionized in a sputtering apparatus, and collides against a target to sputter a target atom which is then deposited on a base plate. For example, Ar is used as the process gas. If the process gas pressure is under 1.33322 Pa, a non-uniform solid phase does not thoroughly form on the base plate, and the density of a second region becomes high or the distance between first regions become small. Thus, the second region is difficult to function as an adsorption/desorption site so that the repeating properties of hydrogen occlusion/release are susceptible to deterioration. Preferably, the process gas pressure is 1.99983 Pa or more. However, when the process gas pressure is too high, it is difficult to form a film. Therefore, it is preferred to use, for example, a process gas pressure not much exceeding about 6.6661 Pa.

WORKING EXAMPLES

1. Preparation of Hydrogen Storage Materials

A magnetron sputtering apparatus was equipped with a Si base plate and a target. The target comprises a commercial disc-type calcined graphite as a carbon source, on the surface of which have been disposed a plurality of Ti, Zr, Hf or Y small pieces having a corner of 5 mm which arranged concentrically. The Si base plate was mounted on a copper-made base stand and the base plate was maintained at about 10° C.(283K) by cooling the base stand with water. Ar was used as the process gas, and the gas pressure was 1.99983 Pa. A hydrogen storage material (sample) was prepared by forming an amorphous carbon film up to a thickness of 2 μm on the base plate. In a case that Ti small pieces were used, it was designated as working example 1. In a case that Y small pieces were used, it was designated as working example 2. In a case that Zr small pieces were used, it was designated as working example 3. In a case that Hf small pieces were used, it was designated as working example 4. The content of Ti (or Zr, Hf, Y) present in the hydrogen storage material was controlled by varying the distance of the small pieces from the center of the calcined graphite. In a word, the distribution of plasma density when sputtering is highest at a position remote by a given distance from the center of the calcined graphite. Thus, when the small pieces were disposed at the place nearest to this position, the content of Ti (or Zr, Hf, Y) is highest.

Figure 3:
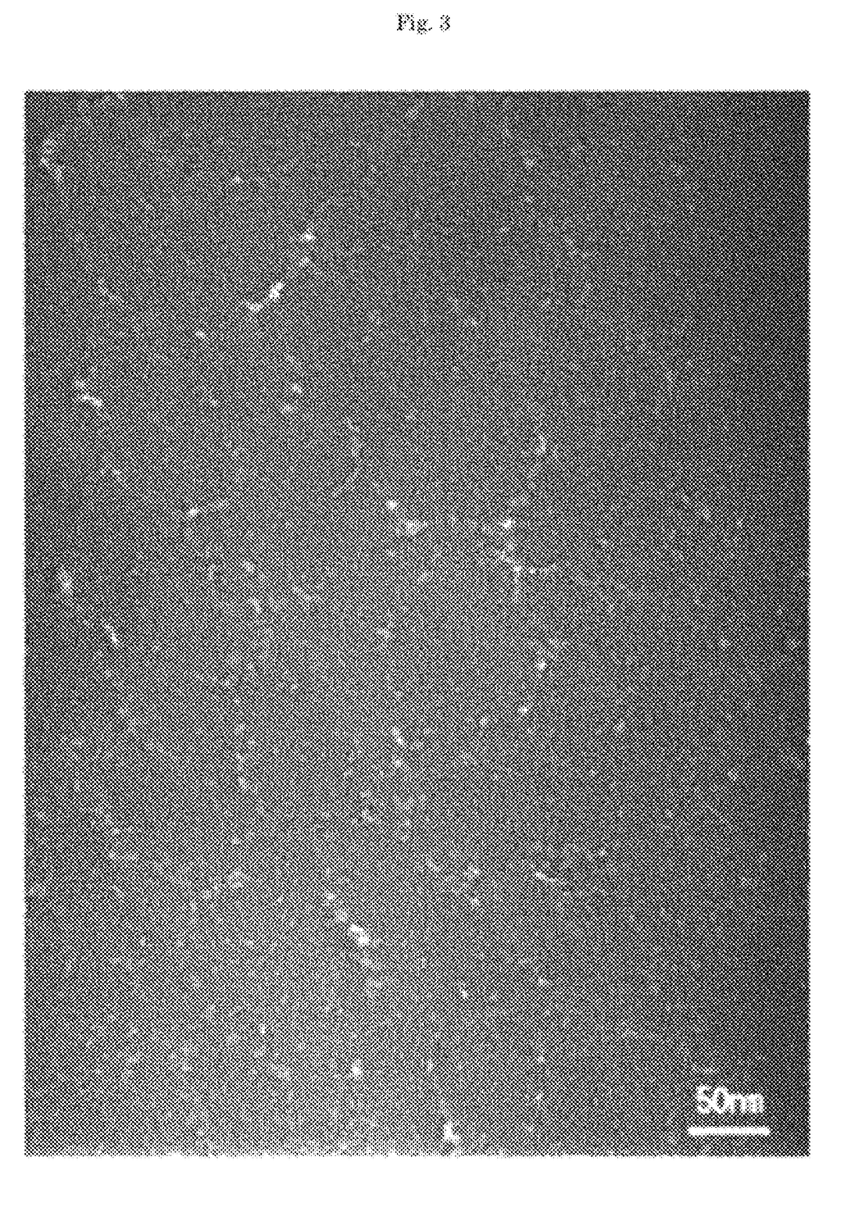
FIG. 3 is a view showing an image of the texture of a hydrogen storage material according to the present invention.
Figure 4:
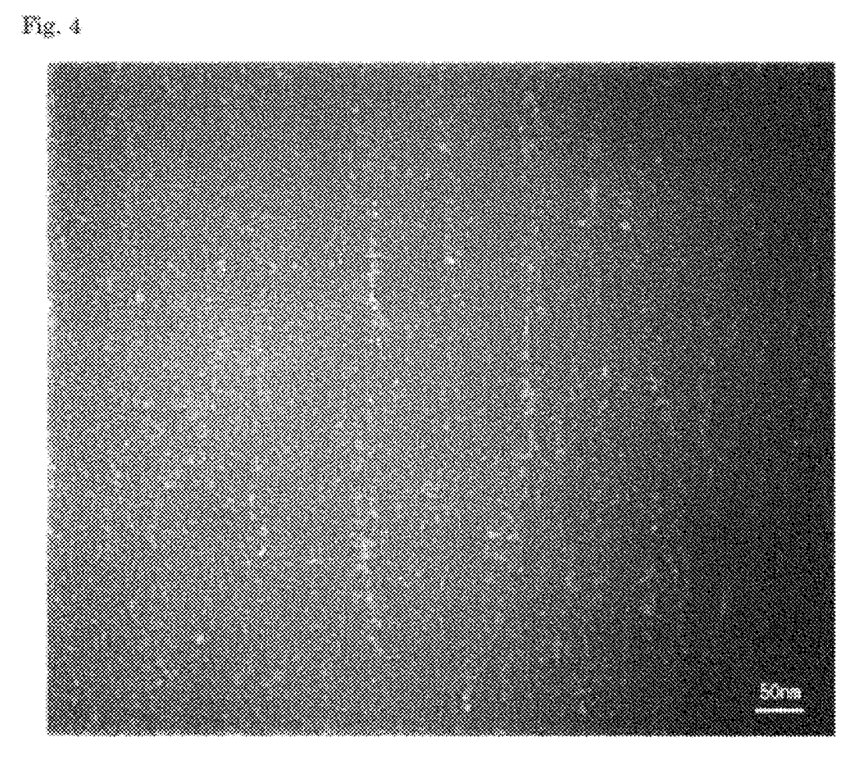
FIG. 4 is another view showing an image of the texture of a hydrogen storage material according to the present invention.
Figure 5:
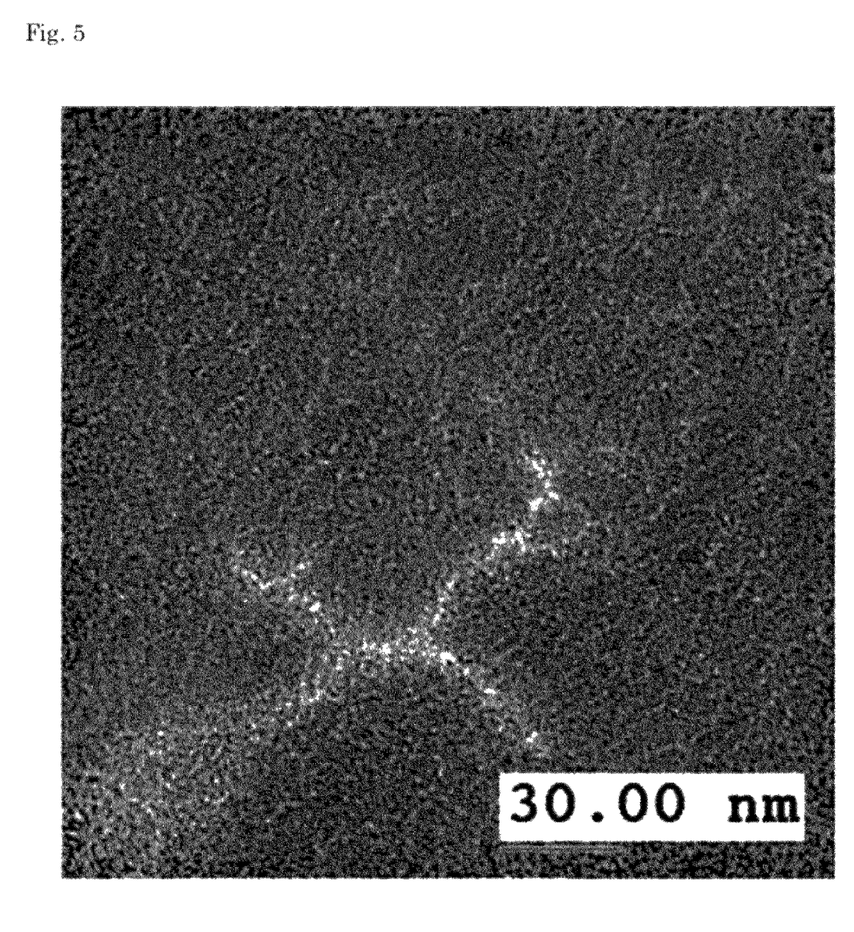
FIG. 5 is further another view showing an image of the texture of a hydrogen storage material according to the present invention.

FIGS. 3 to 6 show photographs of the texture of a film according to working example 1. FIGS. 3 and 5 are TEM (Transmission Electron Microscope) images as seen from the surface direction of the film. FIG. 4 is a TEM image as seen from the direction perpendicular to the film surface (the cross section of the film). In these figures, the white portion indicates a second region and the black portion a first region, respectively. These TEM images were photographed at an accelerated voltage of 200 kV with the use of a field emission transmission electron microscope (Type: Hf2000) manufactured by Hitachi Co., Ltd.

Figure 6:
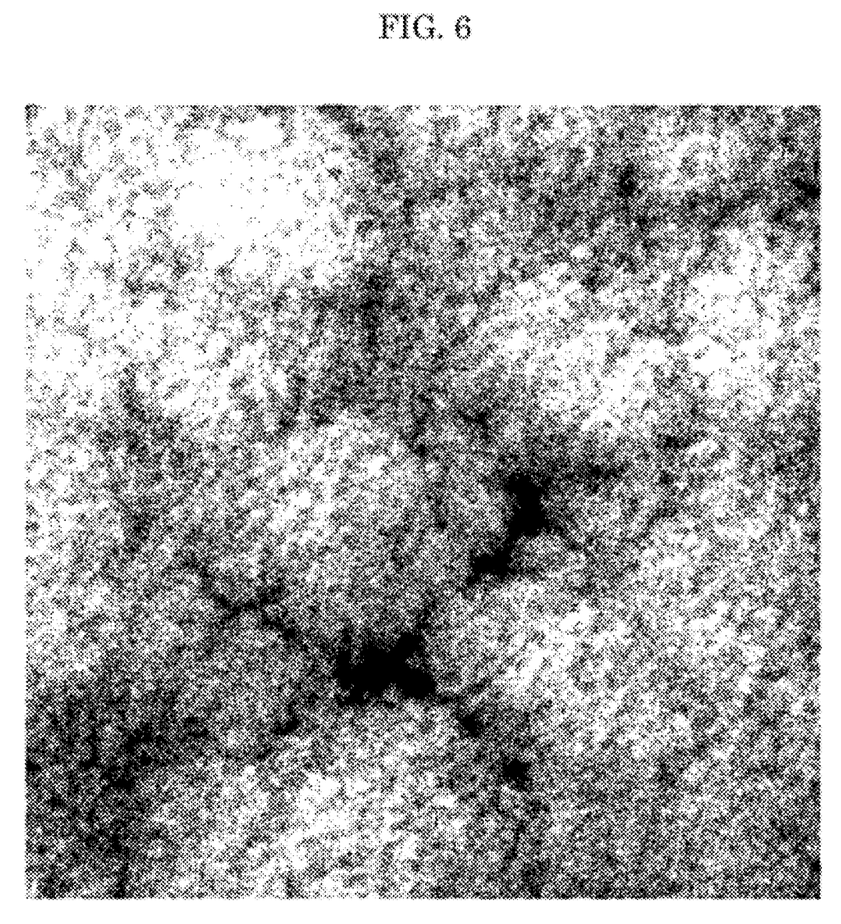
FIG. 6 is furthermore another view showing an image of the texture of a hydrogen storage material according to the present invention.

FIG. 6 is an EF (Energy Filter) image showing a Ti distribution state in the observed zone of the same scale as in FIG. 5. In FIG. 6, the white portion is a region wherein Ti is present. According to EELS (Electron Energy Loss Spectroscopy), a proportion of the density of a second region relative to that of a first region was obtained. The photographing and EELS analysis of the EF image were carried out with the use of an apparatus (Type: Gatan Imaging Filter (GIF) model 678) manufactured by GATAN.

In the EELS determination, by obtaining a ratio of the spectrum intensity to the zero loss spectrum intensity of the entire EELS, and also by obtaining a shift amount(on the order of ~1 eV) of the π+σ peak of carbon in a plasmon loss zone, it was estimated that the density of a second region is about 10% lower than that of a first region. With respect to the EF image, an image obtained by the energy resolution, in a width of 3 eV, of an energy zone of from 13 eV to 28 eV was evaluated. As a result, it was estimated that the density of a second region is about 10 to 40% lower than that of a first region. Further, the texture photographs (TEM photographs of the plane and the cross section) of FIGS. 3 and 4 were subjected to an image analysis. As a result, with respect to working example 1, it was estimated that the volume proportion of a second region present in the hydrogen storage material is about 7%.

By comparison, a sample was obtained wherein a calcined graphite by itself is used as the target and Ti or Y is not included in the hydrogen storage material. This sample is designated as comparative example 1. Further, a sample having no column structure was also obtained wherein a calcined graphite by itself is used as the target and a bias voltage of 100 V direct current is applied to the base plate when sputtering. This sample is designated as comparative example 2. Comparative example 3 is a sample wherein a calcined graphite by itself is used as the target, a mixed gas of 80% of Ar and 20% of methane is used as the process gas, and hydrogen is included at about 40 atomic % in the film formation. Comparative example 4 is a sample obtained by the film formation under the same conditions as in working example 1 with the exception that the Ti content of the hydrogen storage material is 35 atomic %. Comparative example 5 is a sample obtained by the film formation under the same conditions as in working example 1 with the exception that the base plate temperature is 600° C.(873K). Comparative example 6 is a sample obtained by the film formation under the same conditions as in working example 1 with the exception that the process gas pressure is a lower pressure (0.66661 Pa).

2. The Determination of Initial Hydrogen Occlusion Rates

Any of these samples was placed in a vacuum container which was then subjected to vacuum suction up to the extent of 0.1 Pa. Thereafter, it was exposed to a hydrogen gas at room temperature under 0.3 MPa to occlude hydrogen therein. After the exposure, the hydrogen occlusion amount of the sample was determined according to an ERDA (Elastic Recoil Detection Analysis) method using a Rutherford back scattering determination apparatus. The determination was carried out by irradiating a sample with a helium ion (He+) beam at 2,300 keV, and then determining the spectrum at a scattering angle of 30° C. This ERDA method is also called HFS (Hydrogen Forward Spectrometry). Then, this sample was heated up to 773 K and the release starting temperature of hydrogen was determined by means of a Thermal Desorption Spectroscopy ( EMD-WA1400 manufactured by Electric Science Co., Ltd).

3. The Determination of Occlusion/Release Repeating Properties

After the determination of the initial hydrogen occlusion amount as described above, 4 cycles of vacuum suction and exposure to hydrogen were likewise conducted. Thus, a total of 5 cycles of an occlusion/release process was repeated. After these five cycles, the hydrogen occlusion amount was determined according to an ERDA method. The results thus obtained are shown in the following table.

TABLE

| | Element used | Content (wt. %) | Base plate temperature (K) | Process gas pressure (Pa) | Release starting temperature of hydrogen (K) | Initial hydrogen occlusion amount (at %) | Hydrogen occlusion amount after repeating (at %) |
|---|---|---|---|---|---|---|---|
| Working example 1 | Ti | 12.5 | 283 | 1.99983 | 600 | 14.0 | 13.0 |
| Working example 2 | Y | 3.0 | 283 | 1.99983 | 600 | 16.0 | 16.0 |
| Working example 3 | Zr | 8.0 | 283 | 1.99983 | 600 | 13.6 | 13.2 |
| Working example 4 | Hf | 26.0 | 283 | 1.99983 | 600 | 12.5 | 10.8 |
| Comparative example 1 | — | — | 283 | 1.99983 | 600 | 2.0 | 5.0 |
| Comparative example 2 | — | — | 283 | 1.99983 | Not determined | 0.0 | 0.0 |
| Comparative example 3 | — | — | 283 | 1.99983 | 850 | 40.0 | 0.0 |
| Comparative example 4 | Ti | 35.0 | 283 | 1.99983 | Not determined | 0.2 | 0.1 |
| Comparative example 5 | Ti | 12.5 | 850 | 1.99983 | Not determined | 0.0 | 0.0 |
| Comparative example 6 | Ti | 12.5 | 283 | 0.66661 | 650 | 1.2 | 0.7 |

As is obvious from the Table, the working examples illustrate that not only the initial hydrogen occlusion amount is high but also the hydrogen occlusion amount after the repeated occlusion/release process is high (more than 10 at %) so that the deterioration of the repeating properties of hydrogen occlusion/release can be suppressed. Further, in the working examples, it is found that the release starting temperature of hydrogen is lower, i.e., 600 K so that the hydrogen is easy to release.

On the other hand, in case of comparative example 1 wherein Ti, Zr, Hf or Ni is not included in a film and comparative 2 wherein a column structure is not formed therein, both illustrate that not only the initial hydrogen occlusion amount but also the hydrogen occlusion amount after the repeated occlusion/release process is low. Further, in case of comparative example 3 wherein hydrogen is included in a film when formed, it illustrates that the hydrogen occlusion amount after the repeated occlusion/release process is likewise low. From these date, it is obvious that the present invention provides advantageous results by including Ti, Zr, Hf or Ni in a film and forming a column structure therein.

In case of comparative example 4 wherein the content of Ti is 35 atomic %, it is shown that not only the initial hydrogen occlusion amount but also the hydrogen occlusion amount after the repeated occlusion/release process is low. In this comparative example 4, when XRD (X-ray diffraction) was carried out, it was found that the Ti incorporated in the film forms a carbide (TiC). In case of comparative example 5 wherein the base plate temperature in the film formation is 850 K and comparative example 6 wherein the process gas pressure is 0.6661 Pa, both illustrate that not only the initial hydrogen occlusion amount but also the hydrogen occlusion amount after the repeated occlusion/release process is low.

As is obvious from the above, since the hydrogen storage materials of the present invention comprise a first region composed primarily of an amorphous carbon containing at least one metal element selected from the group consisting of Ti, Zr, Hf and Y, and a second region composed primarily of an amorphous carbon having a density lower than that of the first region, they provide a high hydrogen occlusion amount per weight and excellent hydrogen occlusion/release properties, and further can suppress the deterioration of the repeating properties of hydrogen occlusion/release.

Further, since the hydrogen storage materials of the present invention comprise a void present in an amorphous carbon containing at least one metal element selected from the group consisting of Ti, Zr, Hf and Y, they provide a high hydrogen occlusion amount per weight and excellent hydrogen occlusion/release properties, and further can suppress the deterioration of the repeated hydrogen occlusion/release properties Further, since the process for preparation of hydrogen storage materials according to the present invention comprises forming a film from an amorphous carbon containing at least one metal element selected from the group consisting of Ti, Zr, Hf and Y on the surface of a base material at a temperature of 773 K or less according to a gas phase synthesis, the hydrogen occlusion amount per weight is high and the hydrogen occlusion/release properties are excellent, and also the deterioration of the repeating properties of hydrogen occlusion/release can be suppressed.

Further, since the process for the preparation of hydrogen storage materials according to the present invention comprises forming a film from an amorphous carbon containing at least one metal element selected from the group consisting of Ti, Zr, Hf and Y on the surface of a base material under a process gas pressure of 1.33322 Pa or more according to a sputtering process, the hydrogen occlusion amount per weight is high and the hydrogen occlusion/release properties are excellent, and also the deterioration of the repeating properties of hydrogen occlusion/release can be suppressed.

What is claimed is:

1. A hydrogen storage material in the form of a film comprising a first region composed primarily of an amorphous carbon containing from 0.02 to 30 atomic % of at least one metal selected from the group consisting of Zr, Hf and Y, wherein the metal can combine with hydrogen to form a metal hydride or an interstitial hydride, and a second region that extends in a thickness direction of the film composed primarily of an amorphous carbon, the second region having a density from 10 to 40% lower than that of the first region.

2. The hydrogen storage material of claim 1 the average value of the densities of the first and the second region is from 1.4 to 2.2 g/cc$^3$ in a metal free-state.

3. A hydrogen storage material in the form of a film containing voids, wherein the film is of an amorphous carbon containing from 0.02 to 30 atomic % of at least one metal selected from the group consisting of Zr, Hf and Y, wherein the metal can combine with hydrogen to form a metal hydride or an interstitial hydride.

4. The hydrogen storage material of claim 3, wherein the voids extend in a thickness direction of the film.

5. The hydrogen storage material of claim 3, wherein the at least one metal is Y.

6. A hydrogen storage material in the form of a film comprising a first region composed primarily of an amorphous carbon containing from 0.02 to 30 atomic % of at least one metal, wherein the at least one metal is Y, and a second region that extends in a thickness direction of the film composed primarily of an amorphous carbon, the second region having a density from 10 to 40% lower than that of the first region.

\* \* \* \* \*